United States Patent [19]
Yokoya et al.

[11] Patent Number: 5,955,238
[45] Date of Patent: *Sep. 21, 1999

[54] WATERLESS PLANOGRAPHIC PRINTING PLATE AND METHOD OF PLATE MAKING USING THE SAME

[75] Inventors: Hiroaki Yokoya; Toshiaki Aoai; Kazuya Uenishi, all of Shizuoka, Japan

[73] Assignee: Fuji Photo Film Co., Ltd., Kanagawa, Japan

[*] Notice: This patent is subject to a terminal disclaimer.

[21] Appl. No.: 08/812,035

[22] Filed: Mar. 6, 1997

[30] Foreign Application Priority Data

Mar. 8, 1996 [JP] Japan ..................... 8-051529

[51] Int. Cl.$^6$ ............... G03F 7/004; G03F 7/26
[52] U.S. Cl. ............ 430/166; 430/271.1; 430/272.1; 430/273.1; 430/303; 430/944
[58] Field of Search ............... 430/271.1, 272.1, 430/273.1, 303, 166, 944

[56] References Cited

U.S. PATENT DOCUMENTS

| | | | |
|---|---|---|---|
| 4,842,990 | 6/1989 | Herrmann et al. | 430/303 |
| 5,378,580 | 1/1995 | Leenders | 430/303 |
| 5,631,119 | 5/1997 | Shinozaki | 430/166 |
| 5,721,087 | 2/1998 | Yokoya et al. | 430/303 |

FOREIGN PATENT DOCUMENTS

| | | |
|---|---|---|
| 4221879 | 10/1942 | Japan . |
| 158405 | 12/1975 | Japan . |
| 63-88556 | 4/1988 | Japan . |
| 9401280 | 1/1994 | WIPO . |

*Primary Examiner*—John S. Chu
*Attorney, Agent, or Firm*—Sughrue, Mion, Zinn, Macpeak & Seas, PLLC

[57] ABSTRACT

A waterless planographic printing plate, wherein the waterless planographic printing plate comprises a laser-light-sensitive layer which constitute a first layer provided on a support, containing a compound (A) generating an acid by irradiating an actinic light thereto, a compound (B) converting a laser light to heat and a polymer compound (C) which is decomposed by heat under an acidic condition; and a layer which constitutes a second layer having an ink repellent surface thereon. The entire surface of the waterless planographic printing plate is exposed with ultraviolet light. The printing plate is irradiated imagewisely with an infrared laser light to heat the portion irradiated with the laser light, and at least a layer having an ink repellent surface at the portion irradiated with the laser light is removed. The present invention can provide a waterless planographic printing plate capable of laser recording with a high sensitivity and separation developing, and having a high resolving power and an excellent storability, and a method of plate making for the printing plate which is simple and accurate.

20 Claims, No Drawings

WATERLESS PLANOGRAPHIC PRINTING PLATE AND METHOD OF PLATE MAKING USING THE SAME

BACKGROUND OF THE INVENTION

1. Field of the Invention

The present invention relates to a waterless planograhic printing plate capable of printing without using dampening water (hereinafter referred to as waterless printing plate), more particularly, to a waterless planographic printing plate which is usable for direct plate making and which is capable of directly making a printing plate using digital signals outputted from a computer or the like, and to a simplified plate making method by using the waterless printing plate.

2. Description of the Related Art

There have been known typographic printing, gravure printing, planographic offset printing methods and the like as conventional printing methods for performing printing. In recent years, printings using planographic printing plates have been increasing except for special printing fields. In the planographic printing, it has been known a printing plate using dampening water as an ink repellent component, in which a hydrophilic image pattern and a hydrophobic image pattern are formed on the surface of a printing plate, and a waterless printing plate without using dampening water, on the surface of which an ink repellent image pattern and an ink receiving image pattern are formed. The waterless printing plate has advantageous features such that (a) printing can be performed without skillfulness because dampening water is not required for printing, and (b) printing can economically performed in case that a small number of prints is required since the ink density is stable from the beginning of printing and an amount of spoilage is small, as compared with those of printing plates using dampening water.

As the computer technology develops, the plate making process which is a pre-printing process manually operated, has become digitally operated, and printing images has been processed as digital data. For this reason, in recent years, technologies capable of making a printing plate directly from digital image data without using a lithographic film (computer-to-plate technology) have been developed. Among these technologies, there have been known printing plate making technologies using dampening water. However, there have been known few waterless printing plate making technologies. An example in which plate making by using a waterless printing plate is performed by writing with laser beam has been known. In this method, the printing plate is exposed by a laser beam such as an infrared laser beam as a laser light source, and only the exposed area is heated by heat converted from the absorbed beam energy, so that the printing plate is subjected to local combustion and explosion reaction, thereby removing a silicone layer serving as an ink repellent layer, or facilitating removal of the silicone layer. Japanese Patent Publication 42-21879 describes an earliest disclosure of this type of method in which an ink repellent silicone layer of a printing plate is locally removed by irradiating a laser beam thereto, thereby forming a local ink adhesive portion to make a planographic printing plate for use in printing without using dampening water. Further, Japanese Patent Application Laid-Open (JP-A) No. 50-158405 and European Patent No. 0573091 disclose a method for making waterless planographic printing plate in which a printing plate having a silicone rubber surface layer is irradiated with laser light from a YAG laser as an infrared laser and a portion irradiated by the laser is removed to make a planographic printing plate for use in printing.

International Patent Application WO-9401280 discloses a thermal transfer plate making method for a waterless planographic printing plate, in which a printing plate having a silicone layer, a cover sheet being superposed thereon, is irradiated by a laser beam and the silicone layer irradiated by the laser beam is transferred to the cover sheet, thereafter, the cover sheet is peeled off and removed from the plate together with the transferred silicone layer to make a printing plate for use in printing. The specification of this patent appliction describes a method in which a binder which can be decomposed by an acid serving as a catalyst generated from a compound which can generate the acid by applying heat, the binder being added to the silicone layer.

As mentioned above, there have been proposed several plate making methods through converting laser light to thermal energy. However, there are problems to be solved. The above-described waterless planographic printing plates are low sensitive to laser light so that a number of laser light sources for writing are required to compensate the low sensitivity of the plates to achieve a practical recording speed. Consequently, the use of a number of laser light sources results in increase of cost of a writing apparatus. Accordingly, if the sensitivity of the printing plate to laser light, i.e., the sensitivity for writing is increased, the number of the laser light sources can be reduced and the cost of the writing apparatus can be reduces.

Further, the known waterless planographic printing plates above have drawbacks such that the edge sharpness of an image is deteriorated, depending on writing conditions. For example, in case that the output power of a laser source is increased in order to reduce irradiating time with laser light, the edge sharpness of an image is greatly deteriorated. Therefore, there has been an obstacle to reduce writing time.

Furthermore, in a system in which a known compound which generates an acid by the decomposition of the compound is used, the acid generating reaction and the heat decomposition reaction catalyzed by the acid cannot sufficiently proceed within a short period of time during radiation with laser light and the sensitivity of the plate is too low. Moreover, in order to improve separating characteristic between layers through the process of converting laser light to thermal energy, it has been necessary to employ an expensive infrared absorbing agent which is an acid generating agent, resulting in a high cost of printing plate. For example, Japanese Patent Application Laid-Open (JP-A) No. 63-88556 discloses a waterless planographic printing plate comprising: a photosensitive layer containing a compound which generates an acid by irradiating with light (light-acid generating agent), a compound which has a C—O—C bond decomposable by an acid and which changes its solubility by being decomposed, and a water soluble binder; and a silicone rubber layer through an intermediate layer containing amorphous silicic acid. After the printing plate has been exposed, the photosensitive layer is dissolved and removed by use of a developer, and at the same time, the silicone rubber layer thereon is removed to form an ink receiving portion. However, in this system, reactive compounds coexist in the photosensitive layer so that the storability of the printing plate is poor. Further, there have been various drawbacks such that processing of the plate is restricted to dissolving development which requires a solvent to remove the silicone rubber layer or the like, a simple separation development cannot be applicable to the system, and the printing plate is not sensitive to laser light in a longer wavelength region.

SUMMARY OF THE INVENTION

An object of the present invention is to provide a waterless planographic printing plate capable of laser-recording with high sensitivity, and which satisfies required resolving power and storability.

Another object of the present invention is to provide a waterless planographic printing plate capable of an excellent laser recording with a high resolving power and without deterioration of edge sharpness of an image when the printing plate is exposed in a short time.

Still another object of the present invention is to provide a waterless planographic printing plate sensitive to an infrared light capable of a laser recording without using an expensive infrared absorbing agent.

Still another object of the present invention is to provide a waterless planographic printing plate which can be subjected to a simple peeling off development without performing a dissolving development.

Still another object of the present invention is to provide a method of effecting a simple and accurate plate making using the above-described waterless planographic printing plate.

The present inventors have extensively made a study of waterless planographic printing plates capable of writing with a laser, and found that the above-described objects can be achieved the waterless planographic printing plates and the method of plate making which will be described hereinafter.

A waterless planographic printing plate according to the present invention comprises a laser-light-sensitive layer (first layer), provided on a support, containing a compound (A) generating an acid by irradiating an actinic light thereto (hereinafter referred to as a light-acid generating agent), a compound (B) converting a laser light to heat (hereinafter referred to as a light-heat converting agent) and a polymer compound (C) which is decomposed by heat under an acidic condition (hereinafter referred to as an acid decomposable binder), and a layer having an ink repellent surface thereon (hereinafter, optionally referred to as an ink repellent layer) (second layer).

A method of plate making using a waterless planographic printing plate comprises the steps of (1) exposing the entire surface of a printing plate by ultraviolet light or visible light, (2) irradiating the printing plate imagewisely by an infrared laser beam to heat the irradiated portion with the laser beam and (3) removing at least a layer having an ink repellent surface at the portion irradiated with the laser beam, wherein the waterless planographic printing plate comprises a laser-light-sensitive layer (first layer), provided on a support, containing a compound (A) generating an acid by irradiating an actinic light thereto (hereinafter referred to as a light-acid generating agent), a compound (B) converting a laser light to heat (hereinafter referred to as a light-heat converting agent) and a polymer compound (C) which is decomposed by heat under an acidic condition (hereinafter referred to as an acid decomposable binder), and a layer having an ink repellent surface thereon (hereinafter, optionally referred to as an ink repellent layer) (second layer).

The entire surface of a waterless planographic printing plate according to the present invention is pre-exposed prior to the exposure by a laser light so that the light-acid generating agent (A) in the laser-light-sensitive layer decomposes to generate an acid over the entire surface of the printing plate. The printing plate is then imagewisely irradiated with laser light to form a laser-exposed portion and only the laser-exposed portion is selectively heated by the action of the light-heat converting compound. Accordingly, a polymer compound (C) which is decomposed by the action of the acid and heat owing to the above described compounds (A) and (B) so that the adhesion force between the laser-light-sensitive layer and the ink repellent layer, generally a silicone layer, formed thereon is reduced and the ink repellent layer can easily be removed by peeling off or rubbing off to form an ink receiving image pattern.

According to the present invention, chemical changes which cannot be attained only by a conventional heating method through an exposure by the use of a laser light can advantageously be performed in the presence of a catalytic amount of acid, so that the sensitivity to laser light is enhanced. Further, the acid is generated immediately before the exposure with laser light so that the storability of the printing plate can be improved.

DESCRIPTION OF THE PREFERRED EMBODIMENTS

The present invention will be described in detail hereinafter.

A planographic printing plate usable in the present invention comprises a laser-light-sensitive layer (first layer) and an ink repellent layer formed on a support. The laser-light-sensitive layer as the first layer is formed between the support and the ink repellent layer as the second layer.

As the supports for the planographic printing plate of the present invention, known metals, plastic films, papers and supports in any composite form thereof which are generally used for offset printing can be used. The support must satisfy physical characteristics such as mechanical strength, expansion property or the like required for printing conditions to be used. As the supports, a metal support such as aluminum or the like, a plastic support such as polyethyleneterephthalate, polyethylenenaththalate polycarbonate or the like, paper or a composite sheet formed by laminating plastic such as polyethylene, polypropylene on a paper can be exemplified. The thickness of the support is 25 $\mu$m to 3 mm, preferably 75 $\mu$m to 500 $\mu$m. An appropriate thickness of the support may vary with the type of the support to be used and printing conditions. In general, the thickness of the support is most preferable in the range of 100$\mu$ to 300 $\mu$m.

The laser-light-sensitive layer (first layer) disposed on the above-described support of the present invention contains a light-acid generating agent (A), a light-heat converting agent (B) and an acid decomposable binder (C).

The light-acid generating agent (A) does not generate ban acid by absorbing a laser light when a printing plate is exposed by laser light, but generate an acid by absorbing light when the entire surface of a printing plate is exposed prior to the exposure by the laser light.

The light-acid generating agents, i. e., compounds which generate an acid by being decomposed by irradiating an actinic light or a radiation ray include a photo-initiator for cationic photo-polymerization, a photo-initiator for radical photo-polymerization, an optical quenching agent and tenebrescence agent for dyes, or known compounds which generate acids by the action of light and which are used for a microresist or the like, and the mixture thereof can be used arbitrarily by selecting therefrom.

Specifically, the above light-acid generating agents include diazonium salts described in Photogr. Sci. Eng., 18, 387 (1974) by S. I. Schlesinger and Polymer, 21, 423 by T. S. Bal et al; ammonium salts described in U.S. Pat. Nos. 4,069,055, 4,069,056 and Re. 27,992, and Japanese Patent Application No. 3-140140; phosphonium salts described in Macromolecules, 17, 2468 (1984) by D. C. Necker et al., Teh. Proc. Conf. Rad. Curing ASIA, Tokyo, pp. 478

(October 1988) by C. S. Wen et al. and U.S. Pat. Nos. 4,069,055 and 4,069,056; Iodonium salts described in Macromolecules, 10 (6), 1307 (1977) by J. V. Crivello et al., Chem. & Eng. News, 28, 31 (1988), European Patent No. 104,143, U.S. Pat. Nos. 339,049 and 410,201, and Japanese Patent Application Laid-Open (JP-A) Nos. 2-150848 and 2-296514; sulfonium salts described in Polymer J., 17, 73 (1985) by J. V. Crivello et al., J. Org. Chem., 43, 30505 (1978) by J. V. Crivello et al., J. Polymer Sci., Polymer Chem., Ed. 22, 1789 (1984) by W. R. Watt et al., Polymer Bull., 14, 279 (1985) by J. V. Crivello et al., Macromolecules 14 (5), 1141 (1981) by J. V. Crivello et al., J. Polymer Sci., Polymer Chem. Ed., 17, 2877 (1979) by J. V. Crivello et al., European Patent Nos. 370,693, 3,902,114, 233,567, 297, 443, 297,442, U.S. Pat. Nos. 4,933,377, 161,811, 410,201, 339,049, 4,760,013, 4,734,444, 2,833,827, and German Patent Nos. 2,904,626, 3,604,580, 3,604,581; Onium salts such as selenonium salts described in Macromolecules, 10, 1307 (1977) by J. V. Crivello et al. and J. Polymer Sci., Polymer Chem. Ed., 17, 1047 (1979) by J. V. Crivello et al., and such as arsonium salts described in Teh. Proc. Conf. Rad. Curing ASIA, Tokyo, pp. 478 (October 1988) by C. S. Wen et al; Organic halogen compounds described in U.S. Pat. No. 3,905,815, Japanese Patent Publication (JP-B) No. 46-4605, Japanese Patent Application Laid-Open (JP-A) Nos. 48-36281, 55-32070, 60-239736, 61-169835, 61-169837, 62-58241, 62-212401, 63-70243 and 63-298339; organic metal/organic halogen compounds described in J. Rad. Curing, 13 (4), 26 (1986) by K. Meier et al., Inorg. Chem., 19, 3007 (1980) by T. P. Gill et al., Acc. Chem. Res., 19 (12) 377 (1986) by D. Astruc, and Japanese Patent Application Laid-Open (JP-A) No. 2-161445; light-acid generating agent having an O-nitrobenzyl type protective group described in J. Polymer Sci., 25, 753 (1987) by S. Hayase et al., J. Polymer Sci., Polymer Chem. Ed., 23, 1 (1985) by E. Reichmanis et al., J. Photochem., 36, 85, 39 and 317 (1987) by Q. Q. Zhu et al., Tetrahedron Lett., 24, 2205 (1973) by B. Amit et al., J. Chem. Soc., pp. 3571 (1965) by D. H. R. Barton et al., J. Chem. Soc., Perkin I, pp. 1695 (1975) by P. M. Collins et al., Tetrahedron Lett., 17, 1445 (1975) by M. Rudinstein et al., J. Am. Chem. Soc., 110, 7170 (1988) by J. W. Walker et al., J. Imaging Technol., 11 (4), 191 (1985) by S. C. Busman et al., Macromolecules, 21, 2001 (1988) by H. M. Houlihan et al., J. Chem. Soc., Chem. Commun., pp. 532 (1972) by P. M. Collins et al., Macromolecules, 18, 1799 (1985) by S. Hayase et al., J. Electrochem. Soc., Solid State Sci. Technol., 130 (6) by E. Reichmanis et al., Macromolecules, 21, 2001 (1988) by F. M. Houlihan et at., European Patent Nos. 0290,750, 046, 083, 156,535, 271,851 and 0388,343, U.S. Pat. Nos. 3,901, 710, 4,181,531, and Japanese Patent Application Laid-Open (JP-A) No., 60-198538 and 53-133022; compounds exemplified by imionosulfonate compounds or the like which generate sulfonic acid by photo-decomposition described in Polymer Preprints Japan, 38 (8) by M. Tunooka et al., J. Rad. Curing, 13 (4), by G. Berner et al., Coating Technol., 55 (697) 45 (1983) by W. J. Mijs et al., Polymer Preprints, Japan, 37 (3), Akzo, H. Adachi et al., European Patent Nos., 0199,672, 84515, 044,115 and 0101,122, U.S. Pat. Nos. 4,618,564, 4,371,605 and 4,431,774, and Japanese Patent Application Laid-Open (JP-A) Nos. 64-18143, 2-245756 and 4-365048; disulfone compounds described in Japanese Patent Application Laid-Open No. 61-166544; and, o-naphthoquinone diazide compounds described in SPIE (1086), 117 (1989) by G. Buhr et al., J. Photopolymer Sci. Technol., 6 (4), 495 (1993) by R. Hayase et al., and Japanese Patent Application Laid-Open (JP-A) Nos. 53-8128 and 3-140107. Polymers into which the above-described groups or compound which generate an acid by the action of light at their main chain or side chain are introduced can also be used. These polymers are described in J. Am. Chem. Soc., 104, 5586 (1982) by M. E. Woodhouse et al., J. Imaging Sci., 30(5), 218 (1986) by S. P. Pappas et al., Makromol. Chem., Rapid Commun., 9, 625 (1988) by S. Kondo et al., Makromol. Chem., pp. 152, 153 and 163 (1972) by Y. Yamada et al., J. Polymer Sci., Polymer Chem. Ed. 17, 3845 (1979) by J. V. Crivello et al., U.S. Pat. No. 3,849,137, German Patent No. 3,914,407 and Japanese Patent Application Laid-Open (JP-A) Nos. 63-26653, 55-164824, 62-69263, 63-1460387, 63-163452, 62-153853 and 63-146029.

Further, compounds generating an acid by the action of light described in Synthesis, 1, 1 (1980) by V. N. R. Pillai, Tetrahedron Lett., 47, 4555 (1971) by A. Abad et al., J. Chem. Soc., (C), 329 (1970) by D. H. R. Barton et al., U.S. Pat. No. 3,779,778 and European Patent No. 126,712 can also be used.

Among the above-described light-acid generating agents (A), i.e., compounds generating an acid by being decomposed by irradiating actinic light or radiation ray, compounds represented by the groups A-1 to A-4 which can most effectively used in the present invention will be described hereinafter.

(A-1): Oxazole derivatives represented by Formula (I) substituted with a trihalomethyl group or S-triazine derivatives represented by Formula (II):

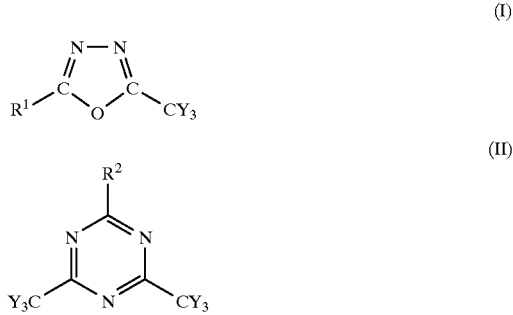

wherein $R^1$ represents a substituted or unsubstituted aryl group or a substituted or unsubstituted alkenyl group, $R^2$ represents a substituted or unsubstituted aryl group, a substituted or unsubstituted alkenyl group, a substituted or unsubstituted alkyl group, or $CY_3$ group, and Y represents a chlorine atom or bromine atom.

Specific examples of oxazole derivatives represented by Formula (I) are compounds I-1 to I-8, and S-triazine derivatives represented by Formula (II) are II-1 to II-10 below, but are not limited to these compounds.

I-1
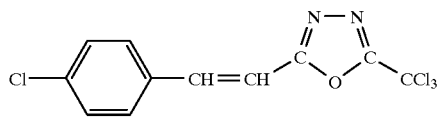
I-2
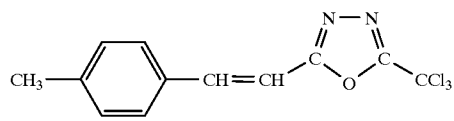
I-3
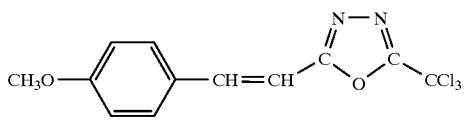
I-4
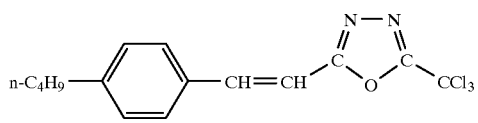
I-5
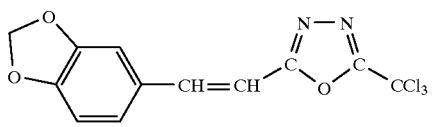
I-6
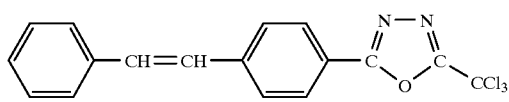
I-7
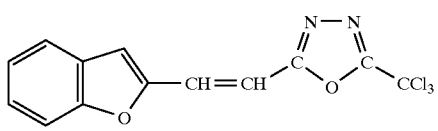
I-8
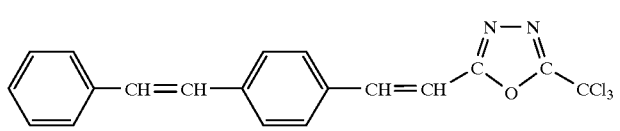
II-1
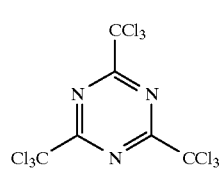

-continued
II-2
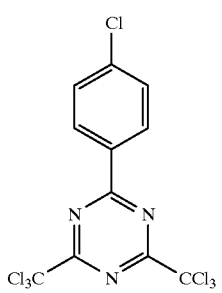
II-3
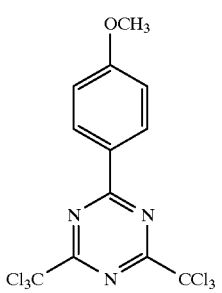
II-4
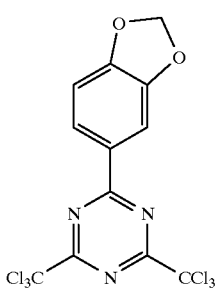
II-5
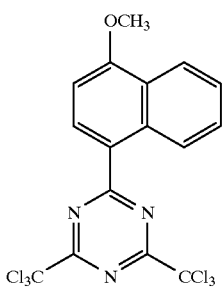
II-6
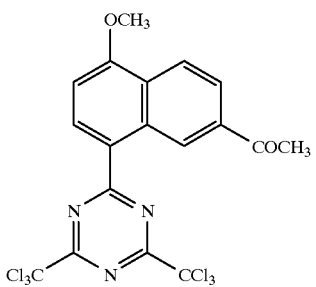

II-7
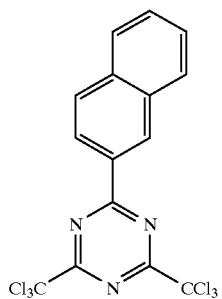
II-8
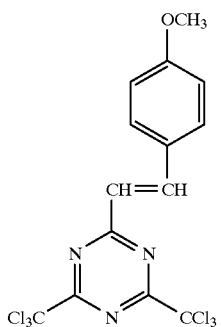
II-9
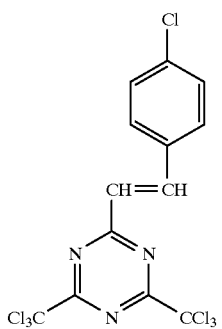
II-10
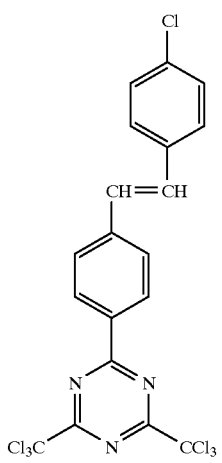

(A-2): Iodonium salts represented by Formula (III) or sulfonium salts represented by Formula (IV);

(III)

(IV)

wherein each of $Ar^1$ and $Ar^2$ represents independently a substituted or unsubstituted aryl group, preferably an aryl group having 6 to 14 carbon atoms or substituted derivatives thereof. Preferable substituents include an alkyl group, a haloalkyl group, a cycloalkyl group, an aryl group, an alkoxy group, a nitro group, a carboxylic group, an alkoxycarbonyl group, a hydroxyl group, a mercapto group and a halogen atom.

Each of $R^3$, $R^4$ and $R^5$ represents independently a substituted or unsubstituted alkyl group, or a substituted or unsubstituted aryl group, preferably an aryl group having 6 to 14 carbon atoms, an alkyl group having 1 to 8 carbon atoms or substituted derivatives thereof. Preferable substituents for an aryl group are an alkoxy group having 1 to 8 carbon atoms, an alkyl group having 1 to 8 carbon atoms, a nitro group, a carboxyl group, a hydroxyl group or a halogen atom, and substituents for an alkyl group are an alkoxy group having 1 to 8 carbon atoms, a carboxyl group or an alkoxycarbonyl group.

$Z^-$ represents a counter anion, for example, $BF_4^-$, $AsF_6^-$, $PF_6^-$, $SbF_6^-$, $SiF_6^-$, $ClO_4^-$, $CF_3SO^-$, $BPh_4^-$ (Ph represents a phenyl group), condensed polynuclei aromatic sulfonic acids such as naphthalene-1-sulfonic acid anion, and anthraquinone sulfonic acid anion, or dyes containing a sulfonic acid group, but is not limited to these groups. Two of $R^3$, $R^4$ and $R^5$, and $Ar^1$ and $Ar^2$ can be bonded each other by a single bond or through a substituent group.

The above-described onium salts represented by Formulae (III) and (IV) have been known and can be synthesized in accordance with the disclosures, for example, in J. Am. Chem. Soc. 91, 145 (1969) by J. W. Knapczyk et al., J. Org. Chem., 35, 2532 (1970) by A. L. Maycoket al., Bull. Soc. Chem. Belg., 73, 546 (1964) by E. Goethas et al., J. Am. Chem. Soc., 51, 3587 (1929) by H. M. Leicester, J. Polymer Chem. Ed. 18, 2677 (1980) by J. B. Crivello et al., U.S. Pat. Nos. 2,807,648 and 4,247,473 and Japanese Patent Application Laid-Open (JP-A) No. 53-101331.

Specific examples represented by III-1 to III-22 and IV-1 to IV-34 of onium compounds which are represented by Formulae (III) and (IV) will be described hereinafter, but are not limited to these compounds.

III-1
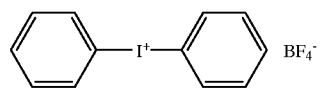

III-2
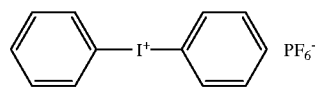

III-3
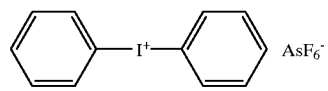

III-4
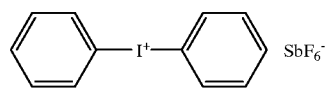

III-5
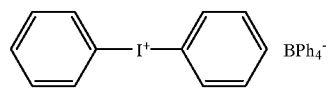

III-6
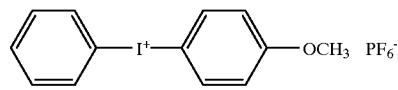

III-7
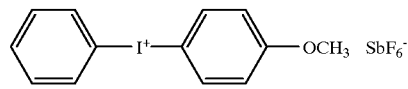

III-8
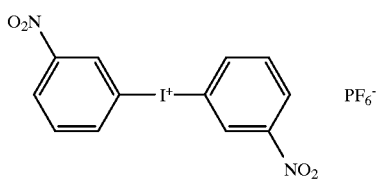
III-9
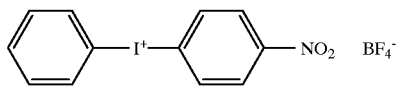
III-10
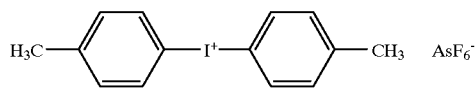
III-11
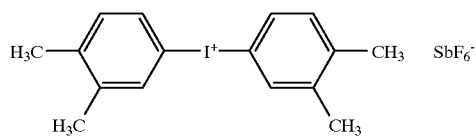
III-12
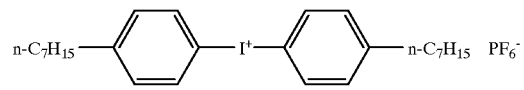
III-13
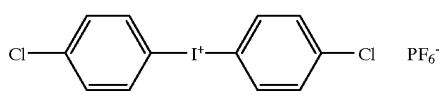
III-14
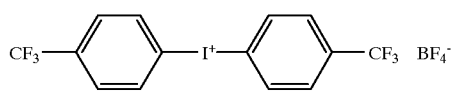
III-15
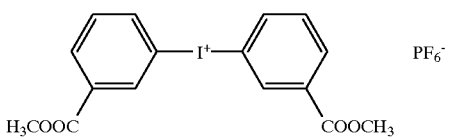
III-16
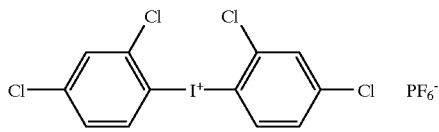
III-17
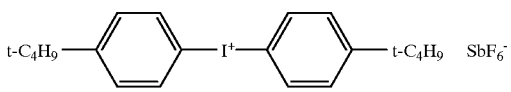
III-18
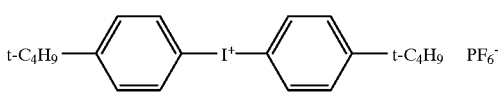

III-19
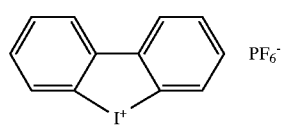
III-20
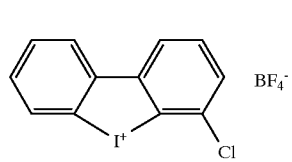
III-21
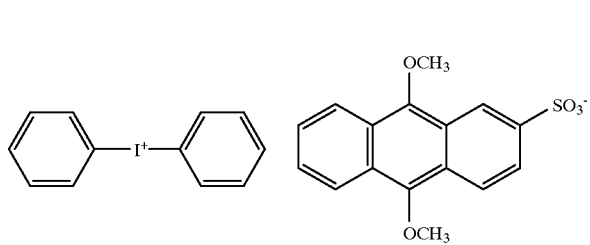
III-22
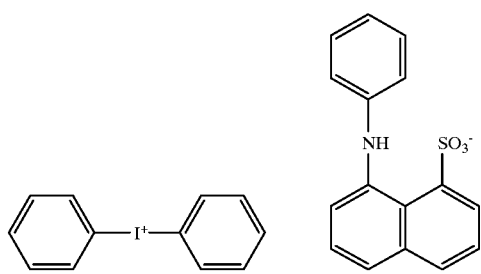
IV-1
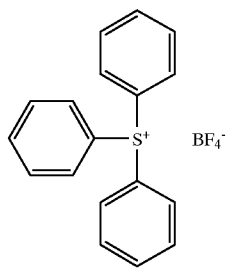
IV-2
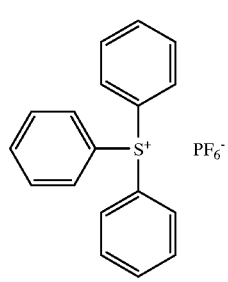

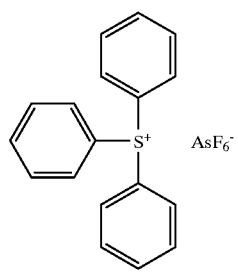
IV-3
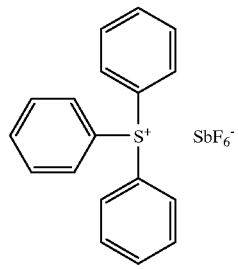
IV-4
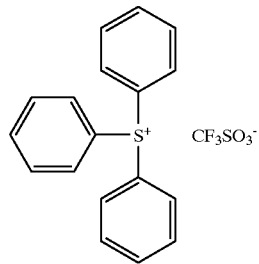
IV-5
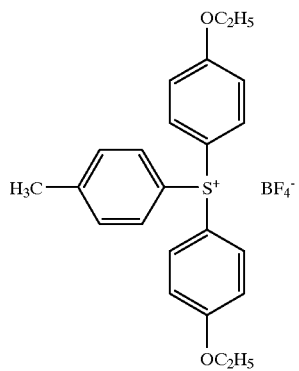
IV-6

IV-7
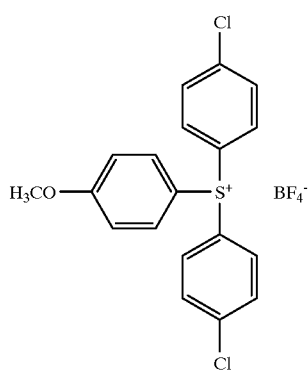
IV-8
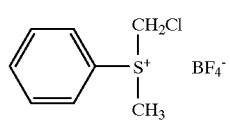
IV-9
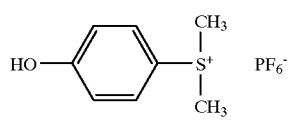
IV-10
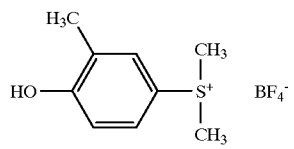
IV-11
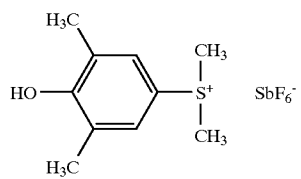
IV-12
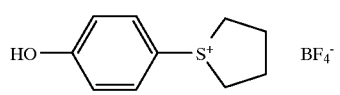
IV-13
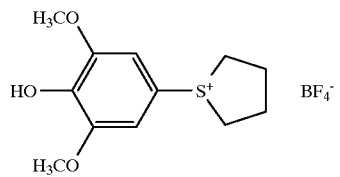
IV-14
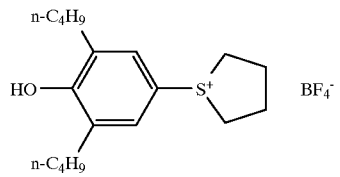

-continued
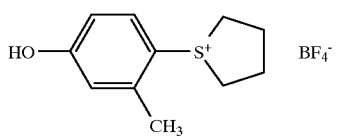 IV-15
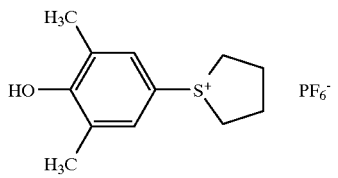 IV-16
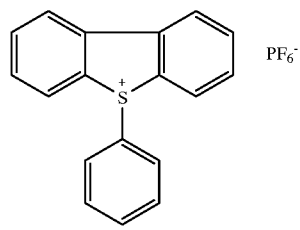 IV-17
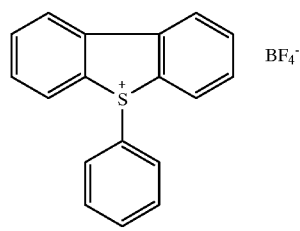 IV-18
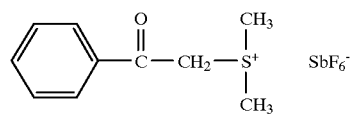 IV-19
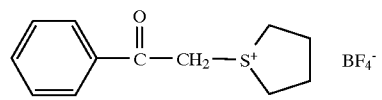 IV-20
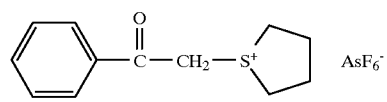 IV-21
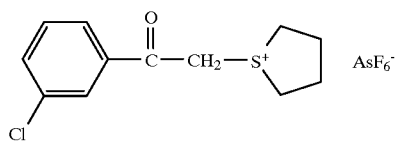 IV-22
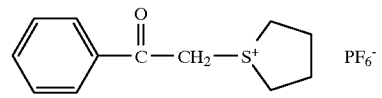 IV-23

-continued
IV-24
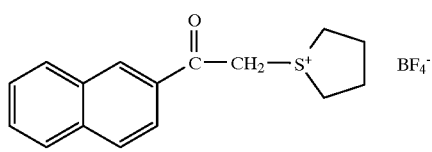
IV-25
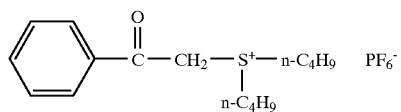
IV-26
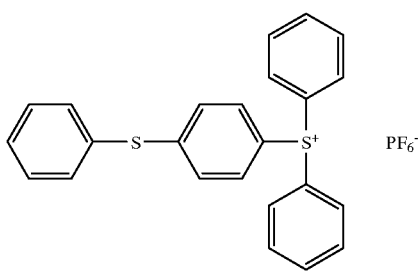
IV-27
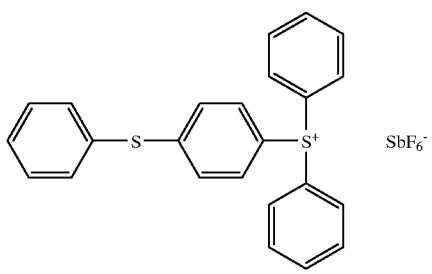
IV-28
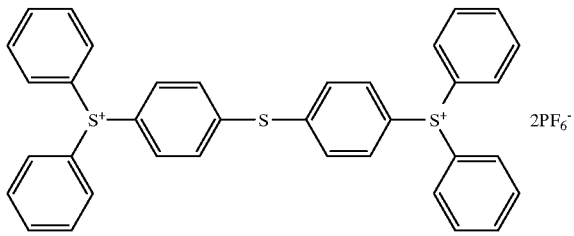
IV-29
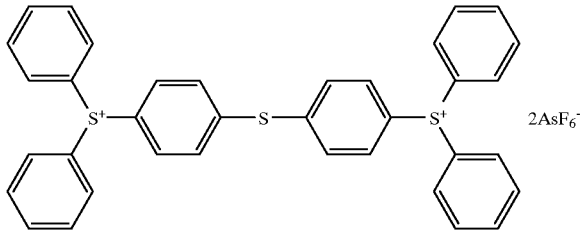

IV-30
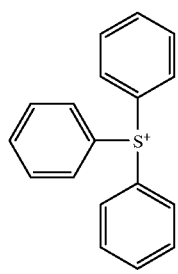 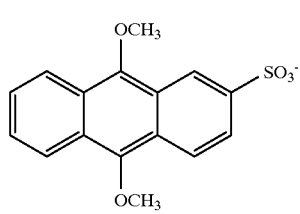
IV-31
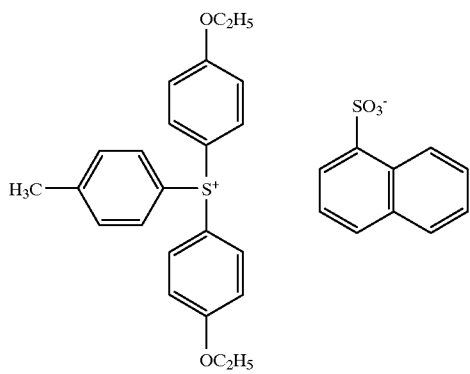
IV-32
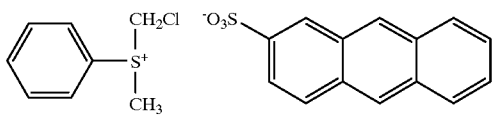
IV-33
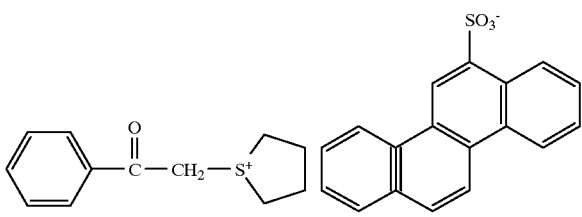
IV-34
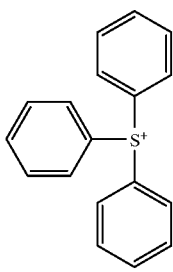 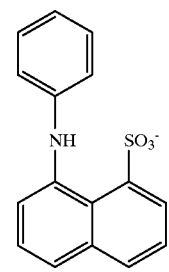

(A-3): Disulfone derivatives represented by Formula (V) or iminosulfonate derivatives represented by Formula (VI);

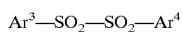

wherein each of $Ar^3$ and $Ar^4$ represent independently a substituted or unsubstituted aryl group, preferably an aryl group having 6 to 14 carbon atoms or substituted derivatives thereof. Preferable substituents include an alkyl group, a haloalkyl group, a cycloalkyl group, an aryl group, a nitro group, a carboxylic group, an alkoxycarbonyl group, a hydroxyl group, a mercapto group and a halogen atom.

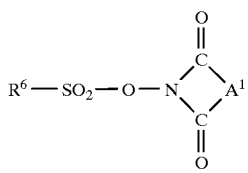

(V)

wherein $R^6$ represents a substituted or unsubstituted alkyl group, or a substituted or unsubstituted aryl group, and $A^1$ represents a substituted or unsubstituted alkylene group, a substituted or unsubstituted alkenylene group, or a substituted or unsubstituted arylene group. $R^6$ is preferably an alkyl group having 1 to 18 carbon atoms, an aryl group having 6 to 14 carbon atoms or substituted derivatives thereof. Preferable substituents include an alkyl group, a haloalkyl group, a cycloalkyl group, an aryl group, an alkoxy group, a nitro group, a carboxyl group, an alkoxycarbonyl group, a hydroxyl group, a mercapto group and a halogen atom. $A^1$ is preferably an alkylene group having 1 to 5 carbon atoms, an alkenylene group having 1 to 5 carbon atoms, an arylene group having 6 to 14 carbon atoms or a substituted derivatives thereof. Preferable substituents include an alkyl group, haloalkyl group, a cycloalkyl group, an aryl group, an alkoxy group, a nitro group, a carboxyl group, an alkoxycarbonyl group, a hydroxyl group, a mercapto group and a halogen atom.

Specific examples V-1 to V-12 and VI-1 to VI-12 which are represented by Formulae (V) and (VI) will be described hereinafter, but are not limited to these compounds.

V-1
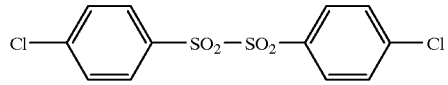

V-2
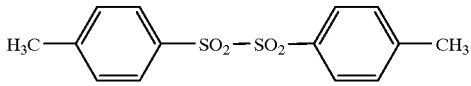

V-3
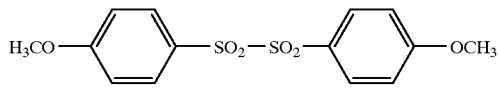

V-4
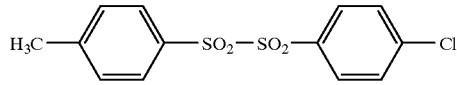

V-5
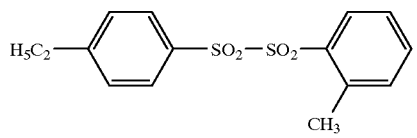

V-6
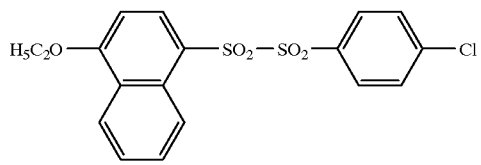

V-7
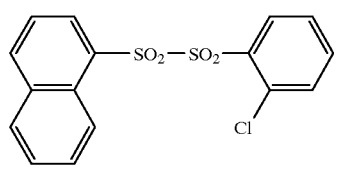

V-8
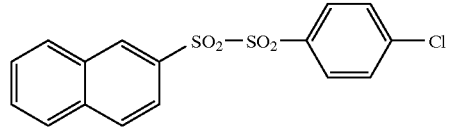

V-9
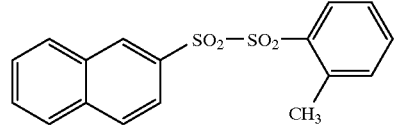

V-10
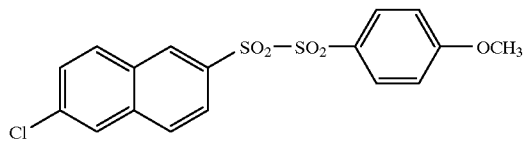

V-11
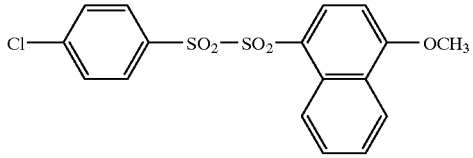

V-12
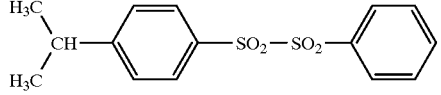

VI-1
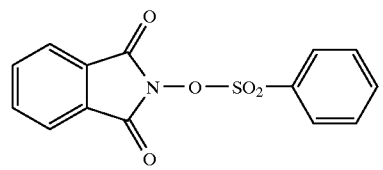

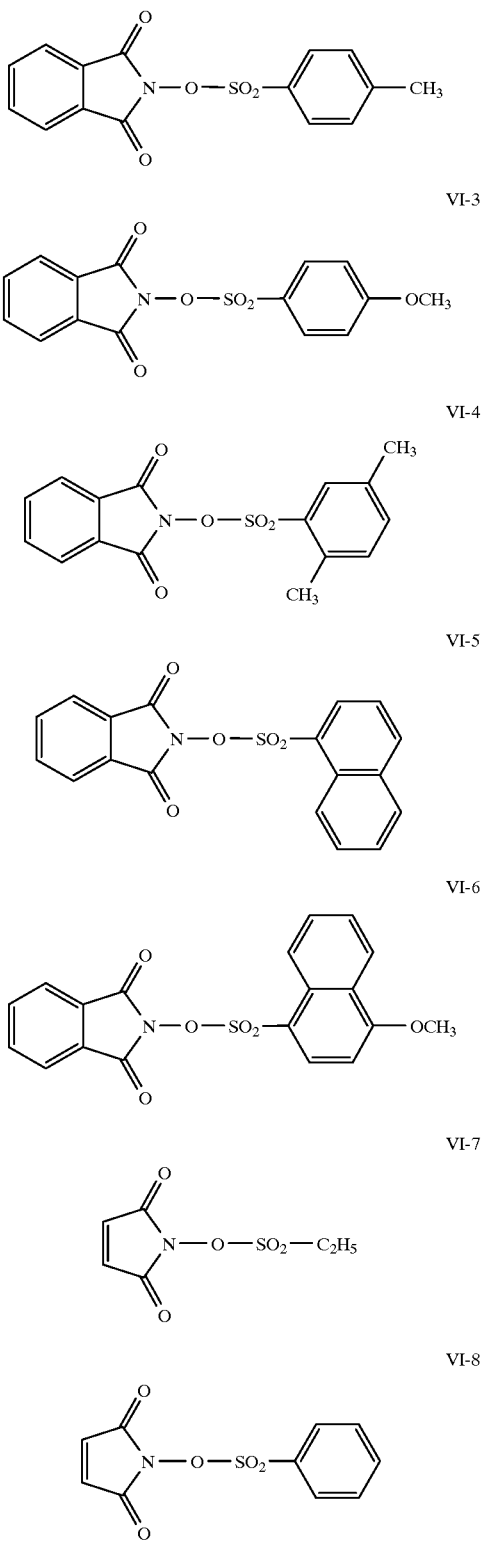

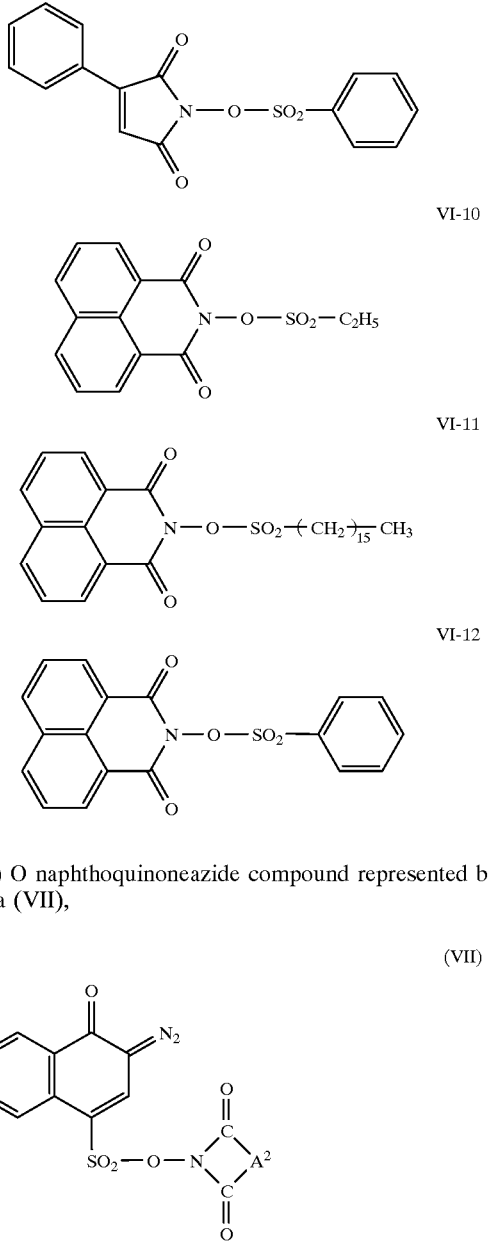

(A-4) O naphthoquinoneazide compound represented by Formula (VII), wherein $A^2$ represents a substituted or unsubstituted alkylene group, a substituted or unsubstituted alkenylene group or a substituted or unsubstituted arylene group. $A^2$ is preferably an alkylene group having 1 to 5 carbon atoms, an alkenylene group having 1 to 5 carbon atoms, an arylene group having 6 to 14 carbon atoms, or substituted derivatives thereof. Preferable examples of the substituents are an alkyl group, a haloalkyl group, a cycloalkyl group, an aryl group, an alkoxy group, a nitro group, a carboxyl group, an alkoxycarbonyl group, a hydroxyl group, a mercapto group and a halogen atom. Specific examples VII-1 to VII-24 represented by Formula (VII) will be described below, but are not limited to these compounds.

VII-1 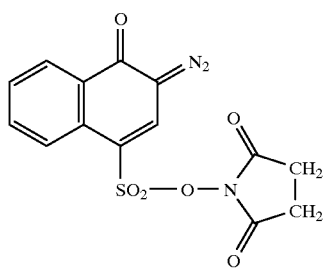
VII-2 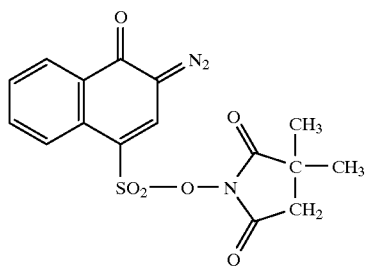
VII-3 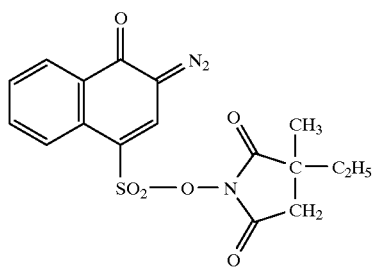
VII-4 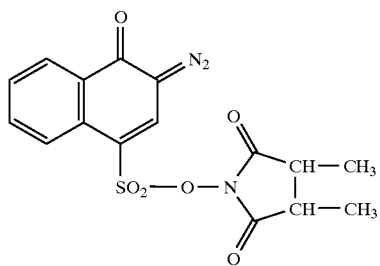
VII-5 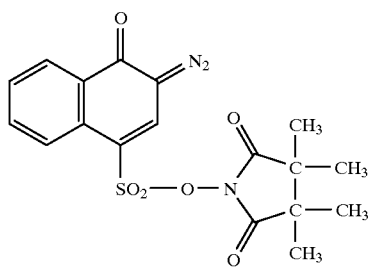
VII-6 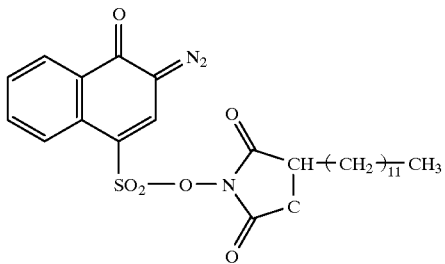
VII-7 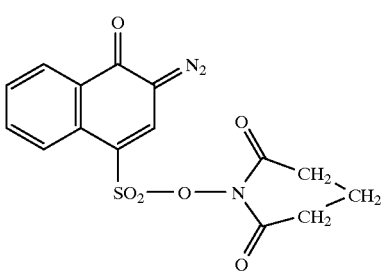
VII-8 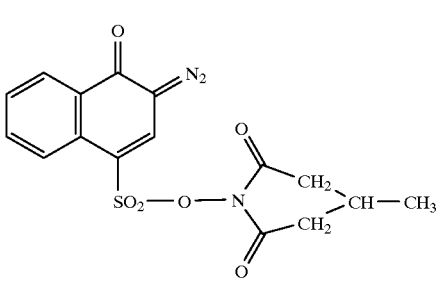
VII-9 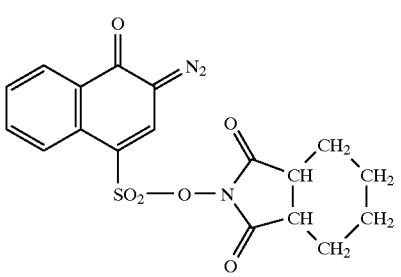
VII-10 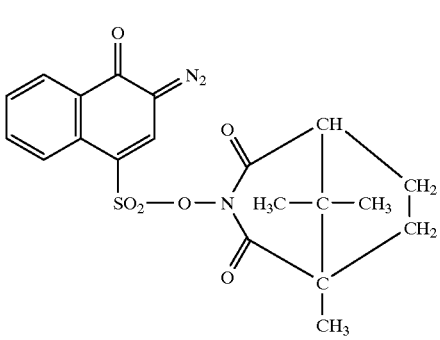

VII-11
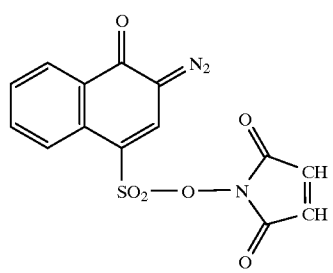
VII-12
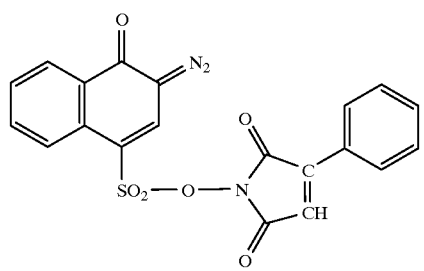
VII-13
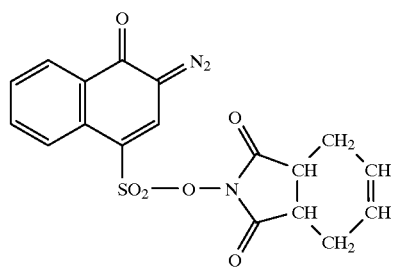
VII-14
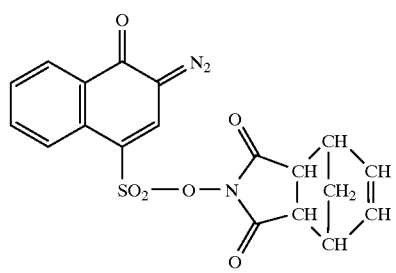
VII-15
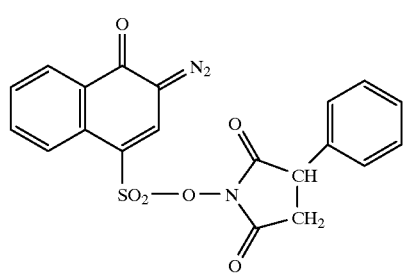
VII-16
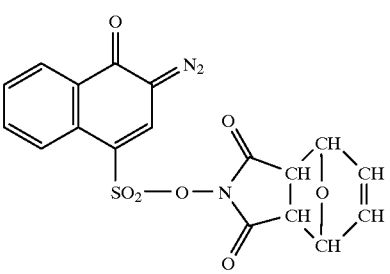
VII-17
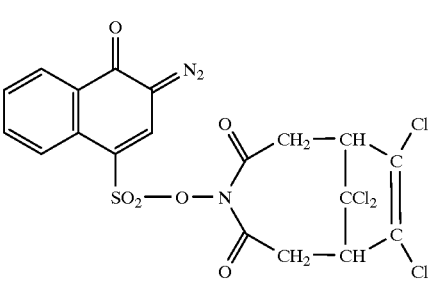
VII-18
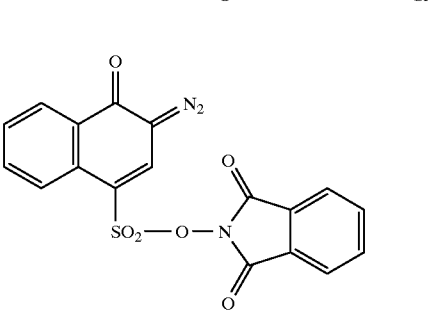
VII-19
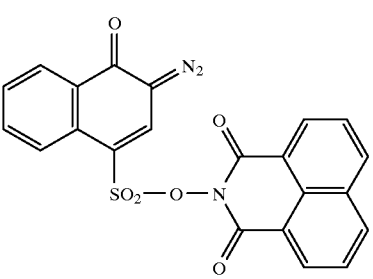
VII-20
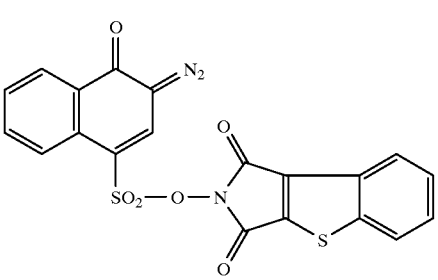

-continued

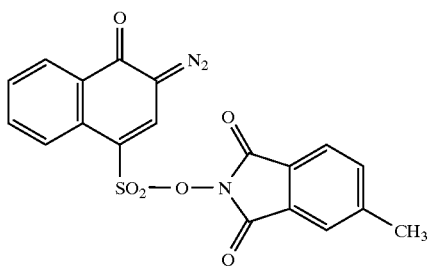

VII-21

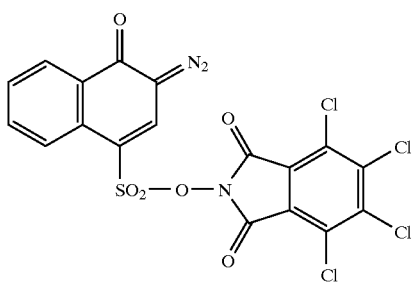

VII-22

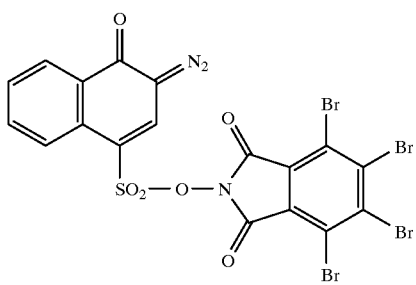

VII-23

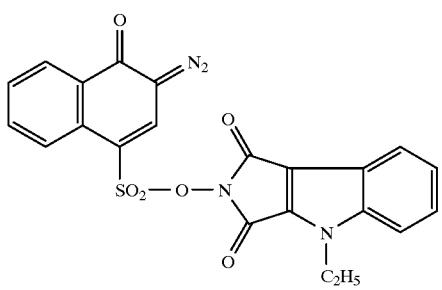

VII-24

The light-acid generating material (A) above is added in an amount of 0.001 to 40% by weight on the basis of the total solid components which constitute a laser sensitive layer, preferably 0.1 to 20% by weight, more preferably 0.2% by weight. When the amount of addition of the light-acid generating compound is too small, the sensitivity of the laser-light-sensitive layer is low. In contrast, when the amount of addition of the acid generating compound is too much, the sensitivity of the laser-light-sensitive layer does not increase over a certain degree and the manufacturing cost becomes high.

The laser-light-sensitive layer of the present invention may contain a compound (sensitizing agent) which can enhance the efficiency of generating an acid by the action of light with the above-described light-acid generating material (A), and various known compounds such as a dye, a pigment, a plasticizer and the like.

As a sensitizing agent, an electron donating compound such as pyrene, perylene or the like, or a merocyanine dye, cyanine dye or the like can be used, but is not limited to these compounds. The ratio of the above-described sensitizing agent to the light-acid generating agent (A) is preferably 0.01/1 to 20/1 in molar ratio, 0.1/1 to 5/1 in weight ratio.

The light-heat converting agent (B) which can be used for the waterless planographic printing plate in the present invention will be described hereinafter. The light-heat converting agent is a compound which has a function such that the compound absorbs a laser light irradiated thereto and converts the absorbed light to heat.

In the present invention, a printing plate has a function that after a light-acid generating agent (A) has been decomposed to form an acidic material by exposing the entire surface of the printing plate, heat is generated to decompose an acid-decomposable binder (C). Only a part of the printing plate to which a laser beam is irradiated is imagewisely heated by the action of a light-heat converting agent (B) to cause imagewisely a decomposing reaction of the acid-decomposable binder.

As light-heat converting agents, when the laser light source is an infrared laser, various organic and inorganic materials, which can absorb infrared light having a wavelength emitted from the laser light source for use in writing, such as an infrared light absorbing dye, infrared light absorbing pigment, infrared light absorbing metal, infrared light absorbing metal oxide, infrared light absorbing metal sulfide and the like can be used.

As organic pigments, a variety of carbon blacks such as acidic carbon black, basic carbon black and neutral carbon black, and surface-modified or surface-coated carbon black for improving dispersing characteristics, and nigrosines can be used. As organic dyes, dyes such as cyanine dyes, merocyanine dyes, phthalocyanine dyes, squalirium dyes, metal dithiolene dyes, naphthoquinone dyes, pyrylium dyes and the like can be used. For example, cyanine dyes disclosed in Japanese Patent Application Laid-Open (JP-A) Nos. 58-125246, 59-84356, 59-202829 and 60-78787, methine dyes disclosed in Japanese Patent Application Laid-Open (JP-A) Nos. 58-173696, 58-181690 and 58-194595, naphthoquinone dyes disclosed in Japanese Patent Application Laid-Open (JP-A) Nos. 58-112793, 58-224793, 59-48187, 59-73996, 60-52940 and 60-63744, squalirium dyes disclosed in Japanese Patent Application Laid-Open (JP-A) No. 58-112792, cyanine dyes disclosed in British Patent No. 434,875 can preferably used. Near infrared light absorbing agents disclosed in U.S. Pat. No. 5,156,938, substituted arylbenzo(thio) pyrylium salts disclosed in U.S. Pat. No. 3,881,924, trimethine pyrylium salts disclosed in Japanese Patent Application Laid-Open (JP-A) No. 57-142645, pyrylium compounds disclosed in Japanese Patent Application Laid-Open (JP-A) Nos. 58-181051, 58-220143, 59-41363, 59-84248, 59-84249, 59-146063 and 59-146061, cyanine dyes disclosed in Japanese Patent Application Laid-Open (JP-A) No. 59-216146, pentamethinethiopyrylium salts disclosed in U.S. Pat. No. 4,283, 475, and pyrylium compounds disclosed in Japanese Patent Publication (JP-B) Nos. 5-13514 and 5-19702 can most preferably be used. Other preferred examples of light-heat converting agents are near infrared light absorbing dyes described as formulae (I) and (II) in U.S. Pat. No. 4,756,993.

As metals or metal oxides, metals such as Mg, Sc, Y, Ti, Zr, Hf, V, Nb, Ta, Cr, Mo, W, Mn, Re, Fe, Co, Ni, Ru, Rh, Pd, Ir, Pt, Cu, Ag, Au, Zn, Cd, Al, Ga, In, Si, Ge, Sn, As, Sb, Bi and Se known in laser recording materials disclosed in Japanese Patent Application Laid-Open (JP-A) Nos. 52-20821 and 59-68847, and mixtures the above metals with metal oxides or metal sulfides such as MoO₂, ZnO₂, NiO, TiO, VO₂, SnS, ZnS and MoS can be exemplified. Further, elector-conductive polymers such as polypyrrole and polyaniline can be used.

The above described light-heat converting agents (B) can be added into the first layer in an amount of 0.01 to 50% by weight, preferably 0.1 to 20% by weight on the basis of total solid portions in the first layer. If the first layer is separated into two layers and the two layers are coated adjacent to each other, which will be described hereinafter, the light-heat converting agent is added in an amount in the above on the basis of the total solid contents in the two layers.

The acid decomposable binder (C) contained in the laser-light-sensitive layer in the waterless planographic printing plate of the present invention is a polymer compound which can be decomposed by heating under an acidic condition. The polymer compounds which have been used in a so called chemical amplifying system in the field of photoresists can be used in the present invention. More preferably, a polymer whose main chain bond is partly severed when heated under an acidic condition to form a low molecular weight polymer can be used. Specifically, such polymers are, for instance, polyorthoesters, polyacetals, polyphthalaldehydes, polyesters, polyurethanes, polycarbonates and the like. These polymers are described in Polymer Journal, 19 (1), 31–49 (1987), Journal of Imaging Science 30 (2), 59 (1986), Polymer Engineering and Science 23, 1012 (1983), J. Electrochem. Sci., 133, 36 (1986), Japanese Patent Application Laid-Open (JP-A) Nos. 48-89003, 53-133429, 56-17345, 59-92532, 62-190211 and 62-136638.

A polymer comprising a unit represented by the following formula as a polycarbonate polymer can preferably be used.

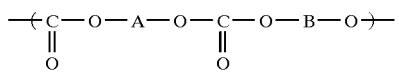

wherein A represents the following divalent group;

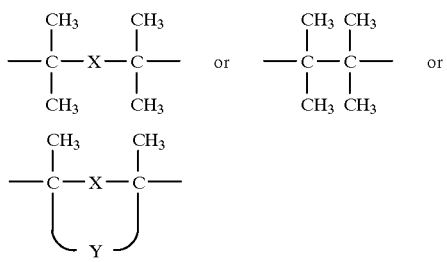

wherein each of X, Y and B represent an arbitrary divalent connecting group.

As polyurethane, a polymer comprising a unit exemplified by the following formula can preferably be used.

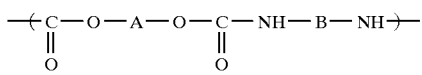

wherein A represents the following divalent group;

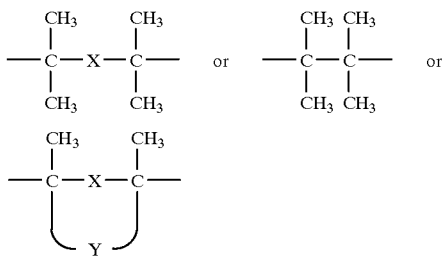

wherein each of X, Y and B represents an arbitrary divalent connecting group.

As polyester, a polymer comprising a unit exemplified by the following formula can preferably be used.

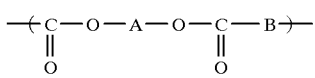

wherein A represents the following divalent group;

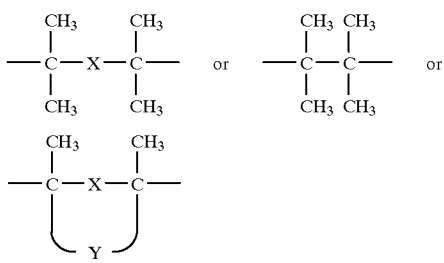

wherein each of X, Y and B represents an arbitrary divalent connecting group.

As polyorthoesters, polyacetals and polyphthalaldehydes, those exemplified in the above-described documents can be used. Specific examples of polymerization units of such polymers will be described below.

(P-1)

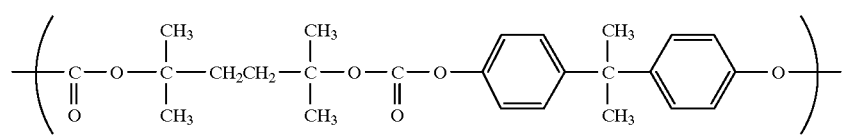

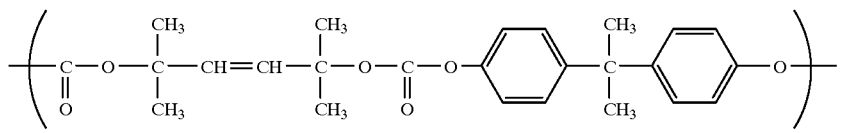
(P-2)
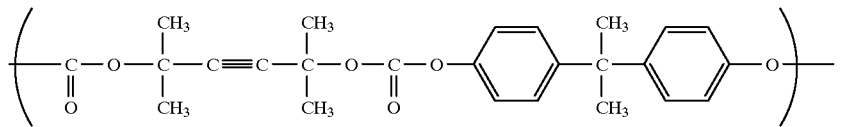
(P-3)
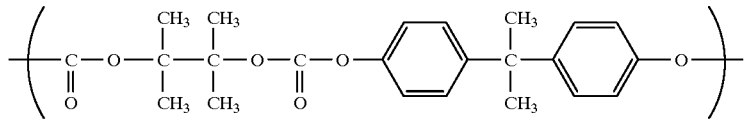
(P-4)
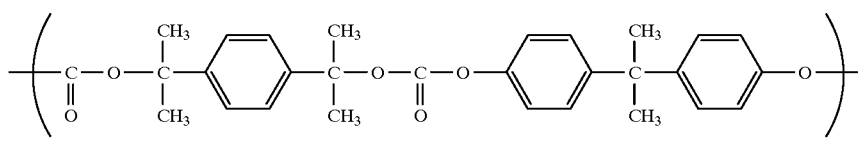
(P-5)
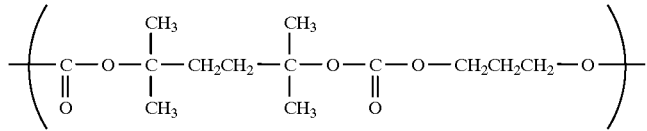
(P-6)
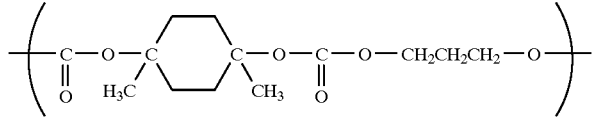
(P-7)
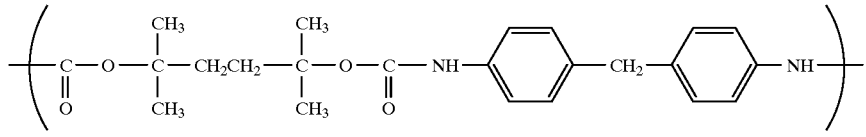
(P-8)
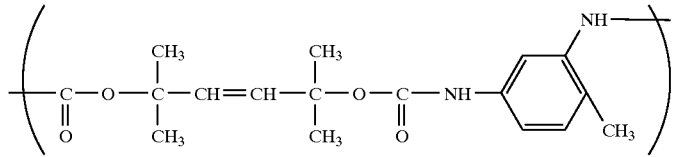
(P-9)
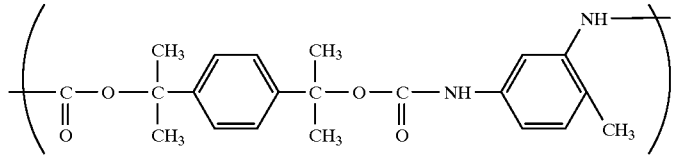
(P-10)

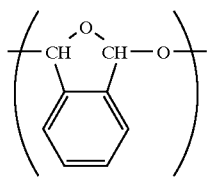
(P-11)

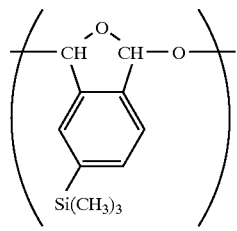
(P-12)

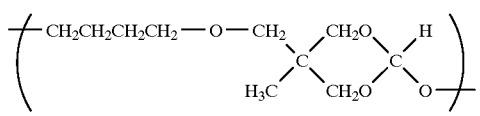
(P-13)

These binders are added in an amount of 10 to 90% by weight, preferably 15 to 75% by weight on the basis of the total solid content of the first layer.

The main chain bonds of these binders are decomposed by being heated in the presence of an acidic material to form low molecular weight components. For example, the polymer compound represented by Formula (P-1) is decomposed in accordance with the following processes.

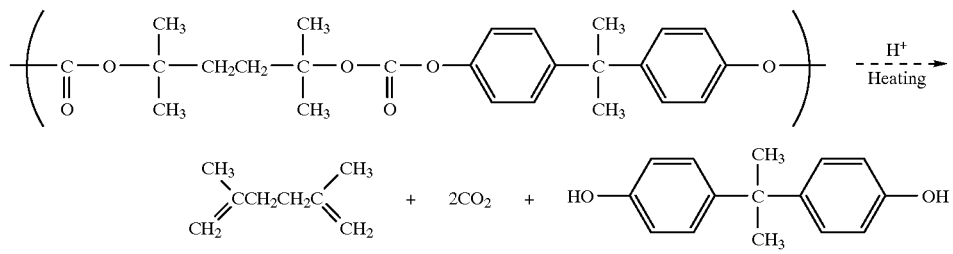

In the present invention, even if a polymer is not decomposed completely as shown in the above, it is sufficient that a part of the main chain of the polymer is decomposed in part to form compounds having a low molecular weight which is less than $1/5$, preferably less than $1/10$ of the molecular weight of the original polymer. That is, it has been found that when a part of a polymer having a molecular weight of 150,000 is partly decomposed to form compounds having an average molecular weight of 15,000, the object that the separation property between the first layer and the second layer is enhanced can be achieved. In this instance, it is sufficient that the polymer is severed at about ten portions in the polymer main chain bond.

The first layer of the present invention may contain known additives for improving various properties of materials constituting a waterless planographic printing plate in such an amount that the additives do not impair the effects of the present invention. These additives are added to the first layer in accordance with various objects for improving the mechanical strength, enhancing the recording sensitivity to the laser light of the first layer, improving the dispersing characteristic of dispersion in the first layer, adhesion force of the first layer to the adjacent layer such as the second layer or the support and the like. For example, in order to enhance the adhesion force between the first layer and the second layer, it is conceivable that a component having a strong interaction with the second layer is contained in the first layer. In this instance, as an auxiliary binder, a polymer compound having a polar group capable of hydrogen bonding is separately added to the first layer. For example, a compound having an amide group or urethane group is a representative of such compound.

Further, the first layer may contain a known material as an additive which can amplify the heat generated in the first layer to increase the recording sensitivity of the first layer. As such material, a compound which generates heat through decomposition reaction thereof can be exemplified. Nitrocellulose is representative one.

When a pigment such as carbon black is used for a light-heat converting agent (B), the dispersing characteristic of the pigment may affect the laser recording sensitivity. It is often required that the degree of dispersion of the pigment is improved for the purpose of coating stably the coating solution of the second layer. For this purpose, various types of pigment dispersing agents can be used as additives. Furthermore, various types of additives such as surface active agents for improving coating properties may be added, as occasion demands.

The thickness of the laser-light-sensitive layer (first layer) is in the range of 0.05 μm to 10 μm, preferably 0.1 μm to 5 μm, in the waterless planographic printing plate of the present invention. If the thickness of the first layer is too thick, undesirable results such as reduction of the laser recording sensitivity may arise.

The first layer may be formed by separating into two layers and superposing on each other. In this instance, the light-heat converting agent (B) may be formed in a thin layer by a vapor deposition method or the like, and another layer containing other components is formed adjacent to the layer formed by the vapor deposition method, so that the two layers are served as a first layer. Thus, in case that a thin layer can be formed by the vapor deposition method, the thickness of the layer is 50 Å to 1000 Å, preferably 100 Å to 500 Å. The thickness of the layer adjacent thereto is 0.005 μm to 10 μm, preferably 0.1 μm to 5 μm. If the thickness is too thick, unfavorable results such as reduction of the laser recording sensitivity may arise.

The ink repellent layer (second layer) of the present invention is a layer having an ink repellent surface, and a compound capable of forming an ink repellent surface which has been known can be used. As a compound capable of forming an ink repellent surface, a substance which has a low surface energy such as a fluorine compound or silicone compound has been known. In particular, silicone rubber (silicone elastomer) is preferably used for the ink repellent layer for the waterless planographic printing plate. The silicone rubber can be classified into (a) condensed type silicone rubber, (b) addition type silicone rubber and (c) radiation hardening type silicone rubber. All of these three types of silicone rubbers can be used for the silicone rubber of the second layer in the waterless planographic printing plate of the present invention.

The condensed type silicone rubber is a silicone rubber formed by condensation reaction. In general, the condensed type silicone rubber can be synthesized by condensing polydimethylsiloxane having a terminal end silanol group (—Si—OH) as a base polymer with a condensed type cross-linking agent represented by the formula below in the presence of known catalysts such as an organic tin compound and organic titanium compound.

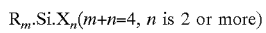

$R_m \cdot Si \cdot X_n (m+n=4, n \text{ is 2 or more})$ wherein R represents an alkyl group having 1 to 10 carbon atoms and aryl group having 6 to 20 carbon atoms, each of which may have substituents. X represents a halogen atom such as chlorine and bromine, hydrogen atom, hydroxyl group, —OCOR$^1$, —OR$^2$ and —O—N=C(R$^4$)—R$^3$, wherein R$^1$ represents an alkyl group having 1 to 10 carbon atoms, aryl group having 6 to 20 carbon atoms, each of which may have substituents. Each of R$^2$, R$^3$ and R$^4$ represents an alkyl group having 1 to 10 carbon atoms and may have substituents.

The addition type of silicone rubber is a silicone rubber which is formed by an addition reaction between a Si—H group and a double bond group through the hydrosilylation reaction. In general, the addition type silicone rubber can be synthesized by allowing polydimethylsiloxane substituted with a vinyl group at a terminal end as a base polymer to react with a cross-linking agent having a plurality of Si—H groups in the presence of known platinum type catalyst through a hydrosilylation reaction.

The radiation hardening type silicone rubber is synthesized by cross-linking reaction of a silicone base polymer having a functional group capable of polymerizing by radiation irradiation. In general, the radiation hardening type silicone rubber is formed through cross-linking reaction by irradiating a base polymer having an acrylic type functional group with ultraviolet ray.

The above-described silicone rubbers are described in detail in "R & D Report No. 22 on Modern Application Technologies of Silicone" (Published by CMC, 1982), Japanese Patent Publication No. 56-23150, Japanese Patent Application Laid-Open (JP-A) No. 3-15553 and Japanese Patent Publication No. 5-1934.

When the second layer is formed with the silicone rubber above, the silicone rubber material is directly coated on the first layer, or through another layer on the first layer to form the second layer. For example, generally, in case of a condensed type silicone rubber or addition type of silicone rubber, a coating solution in which a base polymer, a cross-linking agent and a catalyst are dissolved is coated and heated to allow a cross-linking reaction to form a silicone rubber layer. In case of a radiation hardening type silicone rubber, a coating solution in which a base polymer and an initiator are dissolved is coated, and thereafter the entire coating is exposed to radiation to form a silicone rubber layer.

The thickness of the above-described silicone layers is in the range of 0.3 μm to 20 μm, preferably 0.5 μm to 10 μm, more preferably 0.7 μm to 3 μm.

In order to improve adhesive property of the second layer to a layer adjacent thereto, known adhesive property improving agents may be added to a coating solution for the second layer. Alternatively, the surface of the layer adjacent to the second layer may be pretreated for promoting the adhesion of the second layer to the adjacent layer. It has been known that titanium coupling agents such as polytetrabutyltitanate, polytetraisopropyltitanate and the like are advantageously used for such purposes.

An additive layer may be disposed between the support and the first layer for achieving various objects. For example, in order to improving an ink receiving property at a portion where the silicone rubber has been removed by the exposure with laser light, a layer having an ink receiving property can be disposed. An organic ink receiving coating which has been known can be used for this purpose. For example, various polymer coatings such as acrylic type, methacrylic type, stylene type, vinylester type, polyester type, polyurethane type and the like polymer coatings can be utilized. When the first layer is directly disposed on a non-ink receiving material such as a metal support, such an ink receiving layer is useful.

Further, a coating layer serving as a cushion layer may be provided between a support and a first layer for a pressure relaxation to a silicone layer when printing. The aforementioned organic coating functions sufficiently for this purpose.

Next, a plate making method by using a waterless planographic printing plate according to the present invention will be described hereinafter.

In the present invention, a waterless planograhic printing plate is exposed over the entire surface thereof (pre-exposure) with a light having a wavelength which can be absorbed by a light-acid generating agent prior to the exposure with laser light. This process (1) is carried out with ultraviolet ray or visual light over the entire surface of the printing plate so that the light-acid generating agent is decomposed to generate an acid in a laser-light-sensitive layer. The wavelength of the exposing light is preferably different from the wavelength of the laser light in the subsequent laser exposure. The laser exposure is desirably carried out by the use of light in the infrared region. Accordingly, the pre-exposure is preferably performed by the use of ultraviolet or visible light.

As a light source for the pre-exposure, known exposure light sources such as a mercury lamp, metal halide lamp, xenon lamp, chemical lamp, carbon arc and the like can be used. By effecting the pre-exposure, the sensitivity of the printing plate to the subsequent laser exposure is enhanced so that the energy for writing with laser light can be reduced.

After the above-described pre-exposure (1), the printing plate is imagewisely irradiated with laser light (laser exposure). Namely, this is a process (2) in which the printing plate is imagewisely irradiated with laser light so that the irradiated area of the printing plate is heated. As long as the laser light source can provide a sufficient exposing amount for causing reduction of adhesion force between the first layer and the second layer so that the silicone layer serving as an ink repellent layer can be separated and removed from the first layer, the laser light source is not limited to specific ones. A gas laser such as an Ar laser and carbon dioxide laser, a solid state laser such as a YAG laser and a semiconductor laser can be used. In light of maintenance and cost of the laser, an infrared laser such as a semiconductor laser and solid state laser using stimulated semiconductor such as a YAG laser are preferably utilized. As the recording wavelength of the infrared laser, an oscillating wavelength in the range of 800 nm to 1,100 nm is mainly used.

According to the present invention, an acid is generated in the above-described first process (1), and heat is generated by the action of the light-heat converting agent (B) in the area to which laser light is irradiated in the second process and the acid decomposable binder (C) is partly decomposed by the action of the acid and the heat, thereby reducing the adhesion force between the first layer and the second layer. Owing to the reduction of the adhesion force, the area irradiated with laser light can be removed easily and selectively by applying an external force to the surface of the ink repellent layer comprising silicone rubber so that the process for removing a layer having an ink repellent surface in the exposed area irradiated with laser light is easily carried out, thereby allowing the ink receiving surface to be exposed imagewisely so that a waterless planographic printing plate for use in printing is prepared.

The method of removing the ink repellent layer includes a method of rubbing the silicone surface while applying a liquid which allows the silicone layer to swell or a liquid which does not allow the silicone layer to swell, a method of rubbing the silicone surface without using a liquid, and a method of pressing an adhesive sheet onto the ink repellent second layer after irradiating with laser light and peeling off the sheet to separate and remove the ink repellent layer selectively.

The ink repellent layer at the top surface of the waterless planographic printing plate is removed to allow the ink receiving surface to be exposed to make a waterless planographic printing plate for use for printing.

EXAMPLES

The present invention will be described in detail with reference to Examples hereinafter. However, the present invention is not limited to the Examples.

Example 1
(Support)

A gelatin subbing layer serving as an adhesive layer having a dry thickness of 0.2 $\mu$m was formed on a polyethyleneterephthalate film having a thickness of 175 $\mu$m.
Formation of First Layer
(Preparation of Carbon Black Dispersion)

After the following mixture was dispersed by a paint shaker for 30 minutes, glass beads were filtered off to obtain a carbon black dispersion.

(Composition of Mixture)

| light-heat converting agent: | |
| --- | --- |
| Carbon black (#40; Manufactured by Mitsubishi Carbon) | 5.0 g |
| Polyurethane (Nipporan 2304; Manufactured by Nippon Polyurethane) | 5.0 g |
| Solsperse S20000 (Manufactured by ICI) | 0.27 g |
| Solsperse S12000 (Manufactured by ICI) | 0.22 g |
| Tetrahydrofran | 45 g |
| Glass beads | 160 g |

The following coating solution was coated to form a first layer having a dry thickness of 2 $\mu$m on the above the gelatin subbing layer coated on the polyethyleneterephthalate film.
(Composition of Coating Solution for First Layer)

| Carbon black dispersion above | 55 g |
| --- | --- |
| Light-acid generating agent (XI-5) | 0.2 g |
| Acid decomposable binder (P-1) | 2 g |
| Tetrahydrofran | 45 g |

Formation of Second Layer

The following coating solution was prepared and coated on the first layer, and thereafter, heated at 110° C. for 2 minutes to form a second layer comprising a addition type silicone rubber having a dry thickness of 2 $\mu$m, thereby obtaining a waterless planographic printing plate for use laser recording.
(Composition of Second Layer)

| $\alpha$, $\omega$-divinylpolydimethylsiloxane (polymerization degree: about 700) | 9.00 g |
| --- | --- |
| $(CH_3)_3$-Si-O-$(SiH(CH_3)$-O$)_8$-Si$(CH_3)_3$ | 1.00 g |
| Polydimethylsiloxane (polymerization degree: about 8,000) | 0.50 g |
| Olefin-platinic acid | 0.04 g |
| Inhibitor $H_2C = C$-$C(CH_3)_2$-O-Si$(CH_3)_3$ | 0.07 g |
| Heptane | 55 g |

Plate Making Using Waterless Planographic Printina Plate

The entire surface of the waterless planographic printing plate obtained in the above was exposed by the use of a ultraviolet lamp. Next, a continues line was written on the waterless planographic printing plate with laser beam having a wavelength of 860 nm and a beam diameter of 100 $\mu$m ($1/e^2$)from a semiconductor laser source. The recording energy was 0.75 J/cm$^2$.

Thereafter, an adhesive tape for silicone as an adhesive sheet (Scotch Tape #851A (Trade Name; manufactured by Sumitomo 3M)) was pressed onto the surface of the printing plate and peeled off therefrom so that only a portion, to which the laser beam was irradiated, of the silicone layer as the second layer was adhered to the adhesive tape, thereby removing the portion from the waterless planographic printing plate. Meanwhile, a portion, to which the laser beam was not irradiated, of the waterless planographic printing plate was not removed from the plate and was maintained on the plate, thereby obtaining an image made of silicone having a sharp edge image.

After the entire surface of a waterless planographic printing plate similar to the above had been exposed by use of a ultraviolet lamp, the plate was written with laser beam having a power of 110 mW, wavelength of 825 nm and beam diameter of 10 $\mu$m ($1/e^2$) from a semiconductor laser source at a main scanning speed of 6 m/second. The same adhesive sheet as the above was pressed onto the plate and peeled off from the plate so that the laser irradiated portion was removed to obtain a waterless planographic printing plate for use for printing. The laser recording sensitivity was 150 mJ/cm$^2$, the resolving power was 6 μm, and a waterless planographic printing plate having a sharp edge image was obtained. Under this recording condition, dots having 175 lines were formed and dot percent in the range of 1% to 99% was obtained on the plate.

Printing was carried out by using the waterless planographic printing plates for use for printing thus prepared and 20,000 of excellent prints were obtained without stains. After the waterless planographic printing plates were stored at room temperature for one year, any changes in recording property, printing property and the like were found.

Comparative Example 1

A waterless planographic printing plate of Comparative Example 1 was prepared in the same manner as that of Example 1, except that the light-acid generating agent (XI-5) was not added to a coating solution for the first layer.

The entire surface of the waterless planograhic printing plate obtained was exposed by the use of a ultraviolet lamp, and a continuous line was written with a laser beam from a semiconductive laser in a similar manner to Example 1. Thereafter, an adhesive sheet was pressed onto the surface of the printing plate and peeled off from the surface of the plate. The portion, to which the laser beam was irradiated, was partly removed so that an insufficient printing plate for use for printing was obtained. When the energy for laser exposure increased to four times, a printing plate for use for printing was obtained, but the edge sharpness of the image was insufficient.

Comparative Example 2

A waterless planographic printing plate of Comparative Example 2 was prepared in the same manner as that of Example 1, except that n-butylmethacylate polymer was added to the coating solution for the first layer in place of the acid decomposable binder P-1.

The entire surface of the waterless planograhic printing plate obtained was exposed by the use of a ultraviolet lamp, and a continuous line was written with laser beam from a semiconductive laser in a similar manner to Example 1. Thereafter, an adhesive sheet was pressed onto the surface of the printing plate and peeled off from the surface of the plate. The portion, to which the laser beam was irradiated, was partly removed so that an insufficient printing plate for use for printing was obtained. When the energy for laser exposure increased to three times, a printing plate for use for printing was obtained, but the edge sharpness of the image was insufficient.

Comparative Example 3

The waterless planographic printing plate obtained in Example 1 was subjected to plate making in the same manner as Example 1 except that the pre-exposure with a ultraviolet ray was not performed. The portion to which the laser was irradiated was partly removed and the printing plate for use for printing thus obtained was insufficient for printing. When the energy for laser exposure increased to four times, a printing plate for use for printing was obtained, but the edge sharpness of the image was insufficient.

Examples 2 to 10

Waterless planographic printing plates of Examples 2 to 10 were prepared in the same manner as that of Example 1, except that the light-acid generating agent (A) and the acid decomposable binder (C) were changed to those listed in the following table.

|  | Light-Acid Generating Agent | Acid Decomposable Binder |
| --- | --- | --- |
| Example 2 | IV - 19 | P - 1 |
| Example 3 | VII - 18 | P - 1 |
| Example 4 | III - 6 | P - 1 |
| Example 5 | V - 5 | P - 1 |
| Example 6 | IV - 5 | P - 2 |
| Example 7 | IV - 5 | P - 5 |
| Example 8 | III - 18 | P - 7 |
| Example 9 | IV - 1 | P - 11 |
| Example 10 | V - 4 | P - 13 |

The waterless planographic printing plates obtained were subjected to pre-exposure, laser exposure and silicone removal in the same manner as those of Example 1, printings were performed by the use of the printing plates, and prints having excellent sharpness of images were obtained.

Example 11

On a polyethyleneterephthalate support having a gelatin subbing layer, a metal oxide vapor deposit layer of TiO as a light-heat converting agent was formed in thickness of 200 Å by spattering method. The following coating solution was coated on the vapor deposit layer and dried in dry thickness of 1μ to form a first layer in combination with the vapor deposit layer.

(Composition of Coating Solution of First Layer)

| Light-acid generating agent (IV-5) | 0.2 g |
| --- | --- |
| Acid-decomposable binder (P-3) | 2.0 g |
| Tetrahydrofran | 45 g |
| Methylisobutylketone | 10 g |

A second layer was formed in the same manner as that of Example 1 to obtain a waterless planographic printing plate. The waterless planographic printing plate thus obtained was subjected to pre-exposure, laser exposure and removal of silicone layer in the same manner as those of Example 1. The resultant printing plate was further subjected to printing and a print having an excellent edge sharpness of an image was obtained.

As mentioned above, the present invention can provide waterless planographic printing plates capable of laser recording with a high sensitivity, and having an excellent resolving power and sufficient edge sharpness. Further, the waterless planographic printing plate of the present invention is pre-exposed immediately before an exposure with laser light so that a sufficient storability of the printing plate can be achieved while maintaining a high sensitivity of the printing plate. Furthermore, in the present invention, it is not necessary that an expensive infrared absorbing agent serving as an acid generating agent is used, but an inexpensive infrared absorbing agent such as carbon black can be used. Accordingly, the present invention can provide an inexpensive waterless planographic printing plate having a sufficient resolving power and edge image sharpness. The waterless planographic printing plate of the present invention can be processed under a dry condition such as a separation development. The plate making method for a waterless planographic printing plate of the present invention which is simple and satisfies environmental preservative purposes could be attained.

What is claimed is:

1. A waterless planographic printing plate comprising:
a laser-light-sensitive layer, which constitutes a first layer provided on a support, containing a compound (A) generating an acid by irradiating an actinic light thereto, a compound (B) converting a laser light to heat and a polymer compound (C) which is decomposed by heat under an acidic condition; and
a layer which constitutes a second layer having an ink repellent surface thereon.

2. A waterless planographic printing plate according to claim 1, wherein said polymer compound (C) which is decomposed by heat under an acidic condition is a polymer compound which is partly severed in the main chain thereof to be lower molecular weight by heating under an acidic condition.

3. A waterless planographic printing plate according to claim 2, said polymer compound which is partly severed in the main chain thereof to be lower molecular weight by heating under an acidic condition is at least one polymer compound selected from the group consisting of polyorthoesters, polyacetals, polyphthalaldehydes, polyesters, polyurethane and polycarbonates.

4. A waterless planographic printing plate according to claim 1, wherein said compound (A) generating an acid by irradiating an actinic light thereto is represented by the following general formula (I) or (II),

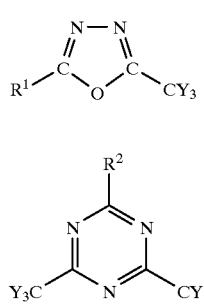

wherein $R^1$ represents a substituted or unsubstituted aryl group, or a substituted or unsubstituted alkenyl group; $R^2$ represents a substituted or unsubstituted aryl group, a substituted or unsubstituted alkenyl group, a substituted or unsubstituted alkyl group, or $CY_3$, wherein Y represents a chlorine atom or bromine atom.

5. A waterless planographic printing plate according to claim 1, wherein said compound (A) generating an acid by irradiating an actinic light thereto is represented by the following general formula (III) or (IV),

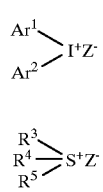

wherein each of $Ar^1$ and $Ar^2$ represents independently a substituted or unsubstituted aryl group, each of $R^3$, $R^4$ and $R^5$ represents independently a substituted or unsubstituted aryl group, or a substituted or unsubstituted aryl group, and $Z^-$ represents an anion.

6. A waterless planographic printing plate according to claim 1, wherein said compound (A) generating an acid by irradiating an actinic light thereto is represented by the following general formula (V) or (VI),

$$Ar^3\text{---}SO_2\text{---}SO_2\text{---}Ar^4 \qquad (V)$$

wherein each of $Ar^3$ and $Ar^4$ independently represents a substituted or unsubstituted aryl group, and

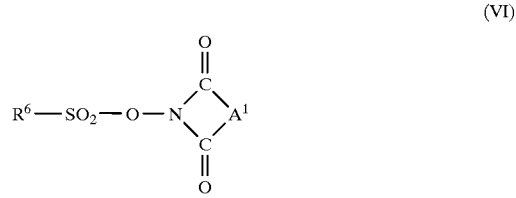

wherein $R^6$ represents a substituted or unsubstituted alkyl group, or a substituted or unsubstituted aryl group, $A^1$ represents a substituted or unsubstituted alkylene group, a substituted or unsubstituted alkenylene group, or a substituted or unsubstituted arylene group.

7. A waterless planographic printing plate according to claim 1, wherein said compound (A) generating an acid by irradiating an actinic light thereto is represented by the following general formula (VII),

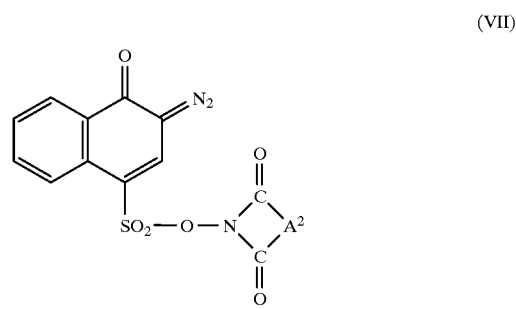

wherein $A^2$ represents a substituted or unsubstituted alkylene group, a substituted or unsubstituted alkenylene group, or a substituted or unsubstituted arylene group.

8. A waterless planographic printing plate according to claim 1, wherein said compound (B) converting laser light to heat is at least one compound selected from the group consisting of an infrared light absorbing dye, infrared light absorbing pigment, infrared light absorbing metal, infrared light absorbing metal oxide and infrared light absorbing metal sulfide.

9. A waterless planographic printing plate according to claim 2, wherein said compound (B) converting a laser light to heat is at least one compound selected from the group consisting of an infrared light absorbing dye, infrared light absorbing pigment, infrared light absorbing metal, infrared light absorbing metal oxide and infrared light absorbing metal sulfide.

10. A waterless planographic printing plate according to claim 3, wherein said compound (B) converting a laser light to heat is at least one compound selected from the group consisting of an infrared light absorbing dye, infrared light absorbing pigment, infrared light absorbing metal, infrared light absorbing metal oxide and infrared light absorbing metal sulfide.

11. A method for plate making for a waterless planographic printing plate, wherein said waterless planographic printing plate comprises a laser-light-sensitive layer which constitutes a first layer provided on a support, containing a compound (A) generating an acid by irradiating an actinic light thereto, a compound (B) converting laser light to heat and a polymer compound (C) which is decomposed by heat under an acidic condition; and a layer which constitutes a second layer having an ink repellent surface thereon, and wherein said method comprises:

(1) exposing the entire surface of said waterless planographic printing plate with ultraviolet light;

(2) irradiating said printing plate imagewise with an infrared laser light to heat the portion irradiated with the laser light, and (3) removing at least a layer having an ink repellent surface at the portion irradiated with the laser light.

12. A method of plate making for a waterless planographic printing plate according to claim 11, wherein said polymer compound (C) which is decomposed by heat under an acidic condition is a polymer compound which is partly severed in the main chain thereof to be lower molecular weight by heating under an acidic condition.

13. A method of plate making for a waterless planographic printing plate according to claim 12, said polymer compound which is partly severed in the main chain thereof to be lower molecular weight by heating under an acidic condition is at least one polymer compound selected from the group consisting of polyorthoesters, polyacetals, polyphthalaldehydes, polyesters, polyurethane and polycarbonates.

14. A method of plate making for a waterless planographic printing plate according to claim 11, wherein said compound (A) generating an acid by irradiating an actinic light thereto is represented by the following general formula (I) or (II),

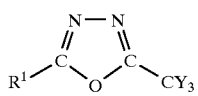

(I)

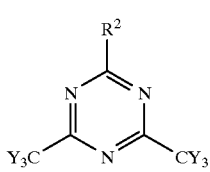

(II)

wherein $R^1$ represents a substituted or unsubstituted aryl group, or a substituted or unsubstituted alkenyl group; $R^2$ represents a substituted or unsubstituted aryl group, a substituted or unsubstituted alkenyl group, a substituted or unsubstituted alkyl group, or $CY_3$, wherein Y represents a chlorine atom or bromine atom.

15. A method of plate making for a waterless planographic printing plate according to claim 11, wherein said compound (A) generating an acid by irradiating an actinic light thereto is represented by the following general formula (III) or (IV),

(III)

-continued

(IV)

wherein each of $Ar^1$ and $Ar^2$ represents independently a substituted or unsubstituted aryl group, each of $R^3$, $R^4$ and $R^5$ represents independently a substituted or unsubstituted aryl group, or a substituted or unsubstituted aryl group, and $Z^-$ represents an anion.

16. A method of plate making for a waterless planographic printing plate according to claim 11, wherein said compound (A) generating an acid by irradiating an actinic light thereto is represented by the following general formula (V) or (VI),

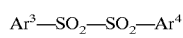

(V)

wherein each of $Ar^3$ and $Ar^4$ independently represents a substituted or unsubstituted aryl group, and

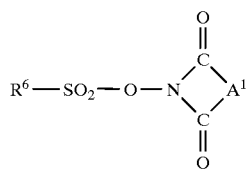

(VI)

wherein $R^6$ represents a substituted or unsubstituted alkyl group, or a substituted or unsubstituted aryl group, $A^1$ represents a substituted or unsubstituted alkylene group, a substituted or unsubstituted alkenylene group, or a substituted or unsubstituted arylene group.

17. A method of plate making for a waterless planographic printing plate according to claim 11, wherein said compound (A) generating an acid by irradiating an actinic light thereto is represented by the following general formula (VII),

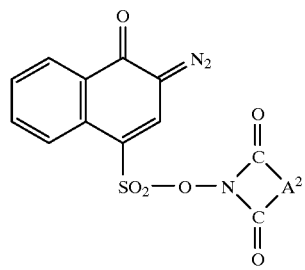

(VII)

wherein $A^2$ represents a substituted or unsubstituted alkylene group, a substituted or unsubstituted alkenylene group, or a substituted or unsubstituted arylene group.

18. A method of plate making for a waterless planographic printing plate according to claim 11, wherein said compound (B) converting laser light to heat is at least one compound selected from the group consisting of an infrared light absorbing dye, infrared light absorbing pigment, infrared light absorbing metal, infrared light absorbing metal oxide and infrared light absorbing metal sulfide.

19. A method of plate making for a waterless planographic printing plate according to claim 12, wherein said compound (B) converting a laser light to heat is at least one compound selected from the group consisting of an infrared light absorbing dye, infrared light absorbing pigment, infrared light absorbing metal, infrared light absorbing metal oxide and infrared light absorbing metal sulfide.

20. A method of plate making for a waterless planographic printing plate according to claim 13, wherein said compound (B) converting a laser light to heat is at least one compound selected from the group consisting of an infrared light absorbing dye, an infrared light absorbing pigment, an infrared light absorbing metal, an infrared light absorbing metal oxide and an infrared light absorbing metal sulfide.

* * * * *